United States Patent

Kitano

Patent Number: 6,057,215
Date of Patent: May 2, 2000

[54] PROCESS FOR FORMING A REFRACTORY METAL SILICIDE FILM HAVING A UNIFORM THICKNESS

[75] Inventor: Tomohisa Kitano, Tokyo, Japan

[73] Assignee: NEC Corporation, Japan

[21] Appl. No.: 08/660,186

[22] Filed: May 31, 1996

[30] Foreign Application Priority Data

May 31, 1995 [JP] Japan ................................. 7-156988

[51] Int. Cl.⁷ ............................ H01L 21/26; H01L 21/28
[52] U.S. Cl. ..................... 438/533; 438/586; 438/649; 438/683
[58] Field of Search .............................. 438/592, 649, 438/655, 657, 682, 683, 533, 586

[56] References Cited

U.S. PATENT DOCUMENTS

| | | | |
|---|---|---|---|
| 5,234,847 | 8/1993 | Iranmanesh | 438/202 |
| 5,369,055 | 11/1994 | Chung | 438/533 |
| 5,512,502 | 4/1996 | Ootsuka et al. | 438/305 |

FOREIGN PATENT DOCUMENTS

| | | |
|---|---|---|
| 0325328 | 1/1989 | European Pat. Off. |
| 6-213076 | 1/1987 | Japan |

OTHER PUBLICATIONS

Amano, J., et al., "Arsenic out–diffusion during TiSi2 formation", Appl. Phys. Lett., vol. 44, No. 8, Apr. 15, 1984, pp. 744–746.

Park, H.K. et al., "Effects of ion implantation doping of the formation of TiSi$_2$", J. Vac. Sci. Technol. A, vol. 2, Apr.–Jun. 1984.

Masahiro Shimizu, et al., "A Novel CMOS Structure with Polysilicon Source/Drain (PSD) Transistors by Self–Aligned Silicidation", IEICE Trans. Electron., vol. E76–C, No. 4, Apr., 1993.

*Primary Examiner*—T. N. Quach
*Attorney, Agent, or Firm*—Hayes, Soloway, Hennessey, Grossman & Hage, P.C.

[57] ABSTRACT

In a process for manufacturing a semiconductor device, an N-well, a field oxide film, a gate oxide film and a polysilicon gate electrode are formed on a P-type silicon substrate. Arsenic is ion-implanted into the substrate using the polysilicon gate electrode as a mask, to form N-type diffused source/drain regions. Boron fluoride is ion-implanted into the N-well using the polysilicon gate electrode as a mask, to form P-type diffused source/drain regions. A titanium film is deposited on the whole surface, and a first heat treatment is carried out at a first temperature to form titanium silicide. Metal titanium remaining on the titanium silicide is removed so as to selectively form titanium silicide on the polysilicon gate electrode, the N-type diffused source/drain regions and the P-type diffused source/drain regions. A second heat treatment is carried out on the refractory metal silicide at a second temperature higher than the first temperature. The above mentioned ion-implantation of the arsenic is so carried out that the peak of the concentration of the ion-implanted arsenic is deeper than the depth "t" by which the silicon substrate is consumed or expended by the silicide formation reaction, and the arsenic concentration at the depth "t" is less than $5 \times 10^{20}$ cm$^{-3}$.

12 Claims, 6 Drawing Sheets

PROCESS FOR FORMING A REFRACTORY METAL SILICIDE FILM HAVING A UNIFORM THICKNESS

BACKGROUND OF THE INVENTION

1. Field of the Invention

The present invention relates to a method for manufacturing a semiconductor device, and more specifically to a metallization process for forming a refractory metal silicide in a large scale integrated circuit, which is capable of particularly preventing a retardation in a silicide formation reaction on an N-type diffused region.

2. Description of Related Art

With an elevated integration density of CMOS (complementary MOS (metal oxide semiconductor field effect transistor)) type semiconductor devices, a junction depth becomes shallow, and therefore, a resistance of an impurity diffused layer increases. This is a hindrance in manufacturing a semiconductor device having a high operation speed. In this situation, there has been used a silicide technology for forming a refractory metal silicide, in a self-alignment manner, on a diffused layer or a polysilicon gate electrode.

Referring to FIGS. 1A to 1E, there are shown diagrammatic partial section views of a semiconductor device for illustrating a process of forming a refractory metal silicide on the basis of a prior art silicide technology.

As shown in FIG. 1A, on P-type silicon substrate 1 having an N-well 2 selectively formed therein and a field oxide film 3 formed thereon to confine a device formation region on the N-well and on the P-type substrate 1, respectively, a gate electrode structure composed of a gate oxide film 4 and a polysilicon gate electrode 5 is formed in accordance with a conventional CMOS semiconductor device manufacturing process. Then, as shown in FIG. 1B, a first mask (not shown) is deposited to cover the N-well 2, and an N-type impurity, for example, arsenic, is implanted into the substrate 1 by using the polysilicon 5 as a mask, to form a pair of N-type diffused (source/drain) regions 8 in the substrate 1.

Thereafter, as shown in FIG. 1C, the first mask is removed, and a second mask (not shown) is deposited to cover the substrate 1 including the N-type diffused regions 8. A P-type impurity, for example, boron fluoride, is implanted into the N-well 2 by using the polysilicon 5 as a mask, to form a pair of P-type diffused (source/drain) regions 9 in the N-well 2. Then, the second mask is removed.

As shown in FIG. 1D, a film 10 of a refractory metal such as titanium is deposited on the whole surface of the substrate by sputtering, and a first heat treatment is carried out in a nitrogen atmosphere, so that a silicide formation reaction is caused to occur simultaneously on the N-type diffused regions 8 and on the P-type diffused regions 9.

Thereafter, unreacted metal titanium is removed by etching, and a second heat treatment is carried out to form a titanium silicide film 11 on the N-type diffused regions 8, on the P-type diffused regions 9 and the polysilicon gate electrodes 5, as shown in FIG. 1E.

In the above mentioned process, when the silicide formation reaction is caused to occur in the first heat treatment, since the silicide formation reaction is influenced by impurities implanted in the N-type diffused layers, the film thickness of the titanium silicide formed on the P-type diffused layer is difference from the film thickness of the titanium silicide formed on the N-type diffused layer. Therefore, it is difficult to set an optimum heat treatment condition common to both the N-type diffused layer and the P-type diffused layer. In other words, since the silicide formation reaction is retarded on the N-type diffused layer, the silicide having only a thin film thickness is formed on the N-type diffused layer, so that the silicide film sheet resistance inevitably increases on the N-type diffused layer. On the other hand, since the silicide formation reaction is hardly retarded on the P-type diffused layer, so that the silicide having a thick film thickness is formed on the P-type diffused layer, so that an on-current drops on the P-type diffused layer, and a leakage occurs between a gate and a source/drain region.

Referring to FIG. 2, there is shown a diagrammatic partial sectional view of a semiconductor device for illustrating another prior art process of manufacturing a semiconductor device, which is disclosed by Japanese Patent Application Laid-open No. JP-A-62-013076.

As shown in FIG. 2, on a silicon substrate having a field oxide film 3 for device isolation, a gate oxide film 4 is formed, and a polysilicon gate is formed on the gate oxide film 4. In order to prevent the silicide formation reaction from being retarded by impurities, the polysilicon gate has a double layer structure composed of a first polysilicon layer 5A having a high concentration of impurity formed on the gate oxide film 4 and a second polysilicon layer 5B having a low concentration of impurity formed on the first polysilicon layer 5A. A refractory metal deposited on the polysilicon gate thus formed reacts on only the polysilicon layer 5B having a low concentration of impurity, so that a refractory metal silicide formation reaction is not retarded.

However, the prior art process proposed by JP-A-62-013076 relates to only the silicide formation reaction on only the polysilicon gate electrode, and therefore, cannot avoid the retardation of the silicide formation reaction on the N-type diffused regions (8 shown in FIG. 1E). Furthermore, JP-A-62-013076 describes that the impurity concentration in the polysilicon layer 5B having a low concentration of impurity is a half of the impurity concentration in the polysilicon layer 5A having a high concentration of impurity. However, it is not sure that, in the disclosed semiconductor device manufacturing method, this concentration distribution has an effect of preventing the silicide formation reaction retardation, but rather, it is considered to be impossible to sufficiently prevent the silicide formation reaction retardation.

SUMMARY OF THE INVENTION

Accordingly, it is an object of the present invention to provide a method for manufacturing a semiconductor device, which has overcome the above mentioned defects of the conventional ones.

Another object of the present invention is to provide a metallization process for forming a refractory metal silicide in a large scale integrated circuit, capable of satisfactorily preventing a silicide formation reaction retardation on all an N-type diffused region, a polysilicon layer and a P-type diffused region, The above and other objects of the present invention are achieved in accordance with the present invention by a method for manufacturing a semiconductor device, including the steps of ion-implanting arsenic into a silicon layer, depositing a refractory metal film on the silicon layer, carrying out a first heat treatment at a first temperature for forming a refractory metal silicide, removing refractory metal remaining on a the refractory metal silicide formed by the first heat treatment and reaction products of the refractory metal other than the refractory metal silicide, carrying out a second heat treatment on the refractory metal silicide at a second temperature higher than the first temperature, characterized in that the ion-implantation of the arsenic is so carried out that the concentration of the arsenic at a boundary between the refractory metal silicide thus formed and the silicon layer is less than $5 \times 10^{20}$ cm$^{-3}$.

In a preferred embodiment, a concentration distribution of arsenic is such that the concentration of the arsenic in the silicon layer at a boundary between the refractory metal film and the silicon layer is lower than the concentration of the arsenic within the silicon layer, and is less than $5 \times 10^{20}$ cm$^{-3}$. In the ion-implantation of arsenic, the peak of the concentration of the implanted arsenic ions is within the silicon layer.

It has been a conventional general practice to dope N-type impurity to a concentration of $5 \times 10^{20}$ cm$^{-3}$ or more, when an N-type diffused region is formed. Within this concentration range of the N-type impurity, the silicide formation reaction is greatly retarded by the N-type impurity included in the N-type diffused layer, as mentioned hereinbefore. To the contrary, in the method in accordance with the present invention, the peak of the concentration of the implanted arsenic ions is within the silicon layer, and the concentration of the arsenic at a boundary between the refractory metal silicide and the silicon layer is less than $5 \times 10^{20}$ cm$^{-3}$. With this feature, the retardation of the silicide formation reaction caused by the arsenic is minimized or prevented. The following is the basis why the retardation of the silicide formation reaction caused by the arsenic is prevented. FIG. 3 and the following table 1 show a relation between a titanium silicide formation reaction and the concentration of arsenic.

The following Table 1 shows a relation between the As dose (cm$^{-2}$) and the As concentration (cm$^{-3}$) at a substrate surface, for a heat treatment time (sec) for the metal silicide formation reaction.

TABLE 1

| Reaction Time (sec) | 0 | 20 | 40 | 80 | 120 |
|---|---|---|---|---|---|
| As Dose (cm$^{-2}$) | | As Concentration (cm$^{-3}$) | | | |
| 2E15 | | | 2E20 | 1E20 | |
| 3E15 | 5E20 | 4E20 | 2E20 | 1E20 | <1E20 |
| 4E15 | 7E20 | 5E20 | 5E20 | 4E20 | |
| 5E15 | 20E20 | | 6E20 | 5E20 | | within latent time

In FIG. 3, the axis of abscissas shows the {heat treatment time T}$^{1/2}$((sec)$^{1/2}$), and the axis of ordinates indicates the fluorescence X-ray intensity (arbitrary unit), which is in proportion to the film thickness of a titanium silicide film (TiSi$_2$) formed in the heat treatment. FIG. 3 illustrates the heat treatment time at a heat treatment temperature of 650° C. versus the film thickness of a titanium silicide film (TiSi$_2$) formed in the heat treatment, for arsenic ion-implantation doses, when arsenic is ion-implanted through an oxide film having a thickness of 25 nm into a silicon substrate under an acceleration energy of 70 KeV.

If the arsenic dose is not greater than $2 \times 10^{15}$ cm$^{-2}$, the film thickness of the titanium silicide film increases in proportion with the heat treatment time. Namely, the silicide formation reaction advances with being controlled by diffusion.

On the other hand, when the arsenic dose is not less than $3 \times 10^{15}$ cm$^{-2}$, titanium silicide is not formed if the heat treatment time is short, namely, at an initial stage of the reaction. In other words, the silicide formation reaction is retarded by arsenic, so that a latent period of the reaction exists. The TABLE 1 shows the measurement result of the concentration of the arsenic at a surface of the silicon substrate in various samples, which changes with the heat treatment time. During the latent period in which TiSi$_2$ is not formed, the concentration of the arsenic at the surface of the silicon substrate is $5 \times 10^{20}$ cm$^{-3}$ or more. With increase of the heat treatment time, the arsenic is diffused into the titanium silicide, and when the concentration of the arsenic at the boundary between the titanium film and the silicon substrate becomes less than $5 \times 10^{20}$ cm$^{-3}$, the titanium silicide (TiSi$_2$) initially starts to be formed.

From FIG. 3 and the TABLE 1, and in view of a measurement error of the concentration, the inventor concluded that the titanium silicide can be formed on an arsenic-diffused N-type layer without retardation of the silicide formation reaction, if the concentration of arsenic is less than $5 \times 10^{20}$ cm$^{-3}$.

On the other hand, on a P-type diffused layer typified by a boron diffused layer, the silicide formation reaction is not retarded by the impurity included in the P-type diffused layer, in a concentration range ordinarily used for forming P-type diffused layer. In other words, the film thickness of the silicide formed on the P-type diffused layer does not change dependently upon the concentration of impurity included in the P-type diffused layer.

Accordingly, it is theoretically possible to prevent the retardation of the silicide formation reaction on the N-type impurity doped region by controlling the impurity concentration of the N-type impurity doped region to less than $5 \times 10^{20}$ cm$^{-3}$, so that the film thickness of the silicide formed on the N-type diffused (source/drain) region and the impurity doped polysilicon (gate) can be made substantially equal to the film thickness of the silicide formed on the P-type diffused region.

In this connection, it may be considered to control the film thickness of the silicide formed on the P-type diffused region by means of controlling the impurity concentration of the P-type diffused region. However, this is not possible, since, as mentioned above, the film thickness of the silicide formed on the P-type diffused layer does not change dependently upon the concentration of impurity included in the P-type diffused layer.

The above and other objects, features and advantages of the present invention will be apparent from the following description of preferred embodiments of the invention with reference to the accompanying drawings.

DESCRIPTION OF THE PREFERRED EMBODIMENTS

Referring to FIGS. 4A to 4D, there are shown diagrammatic partial section views of a semiconductor device for illustrating an embodiment of the process in accordance with the present invention for forming a refractory metal silicide.

Figure 1A:
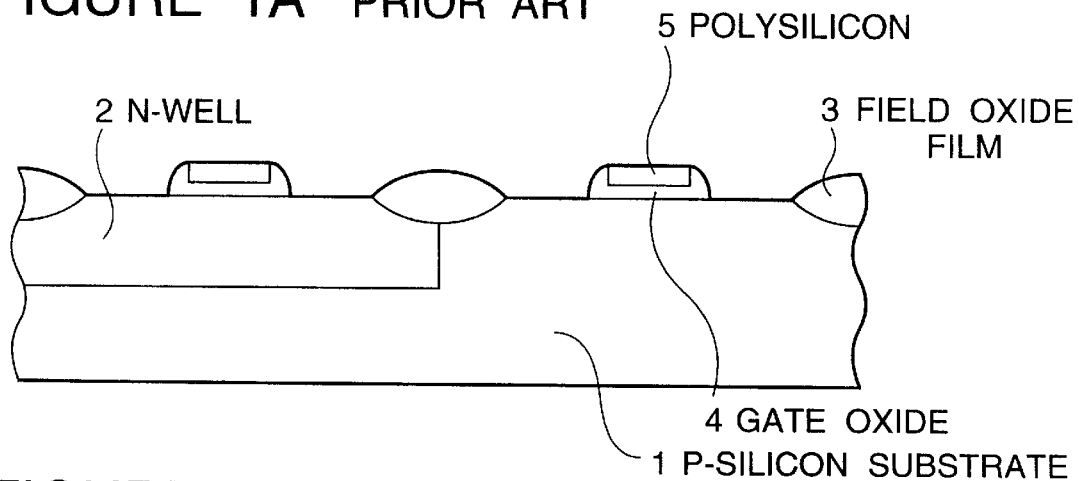
FIGS. 1A to 1E are diagrammatic partial section views of a semiconductor device for illustrating a process of forming a refractory metal silicide on the basis of a prior art silicide formation technology.
Figure 1B:
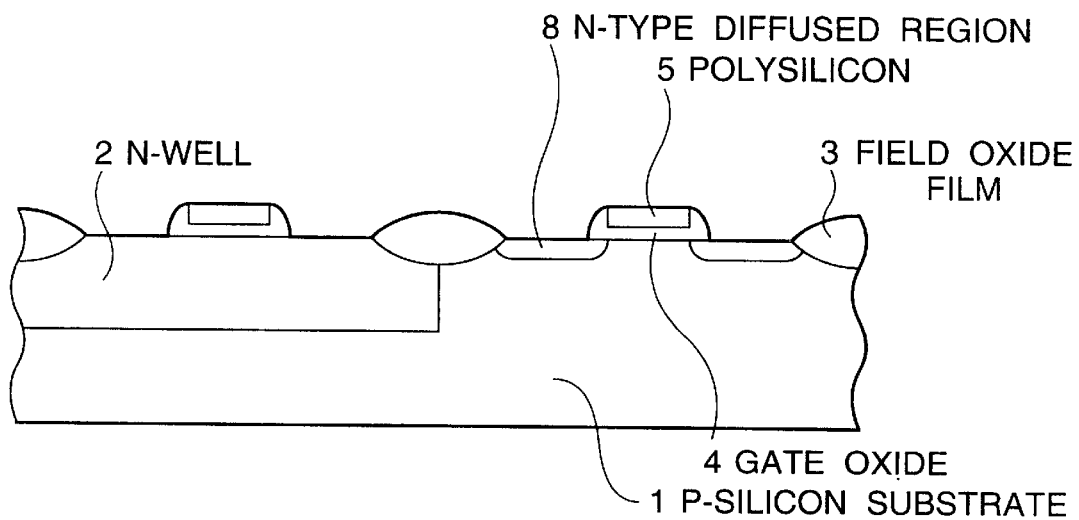
Figure 1C:
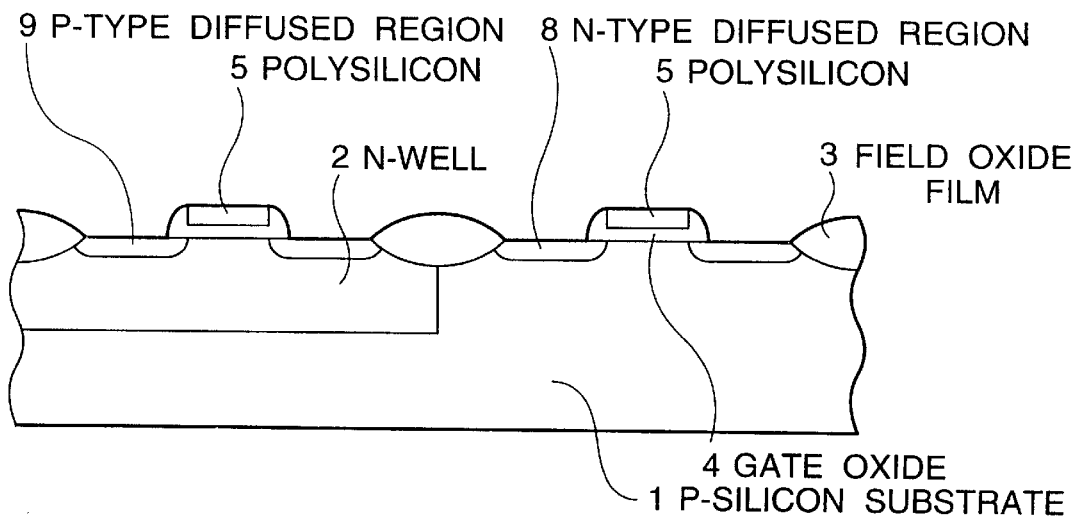
Figure 1D:
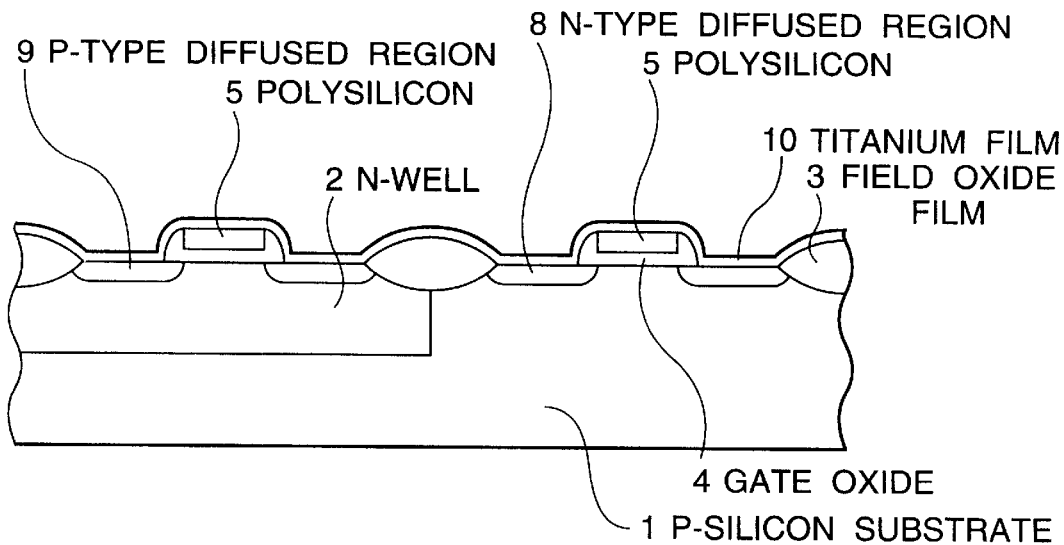
Figure 1E:
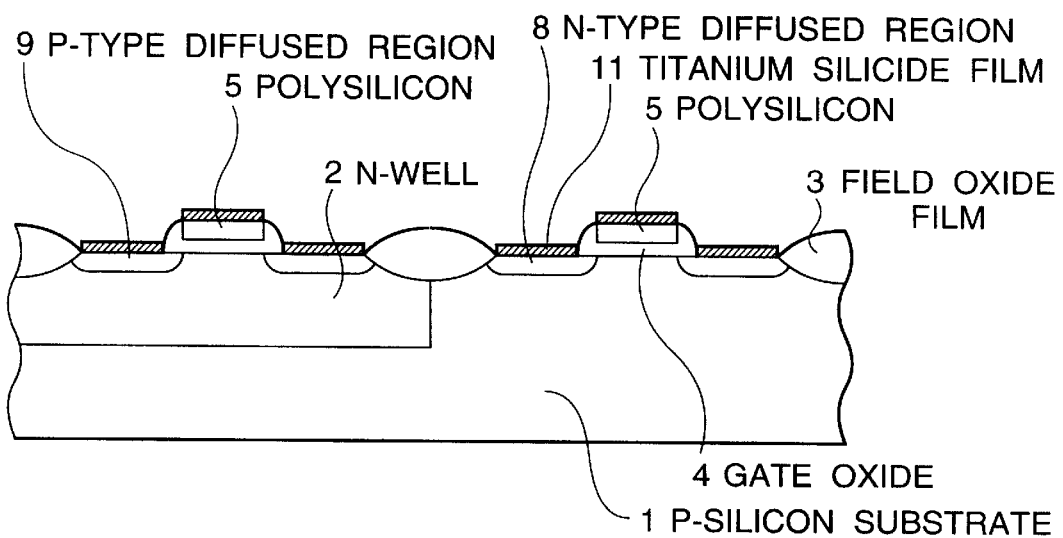
Figure 2:
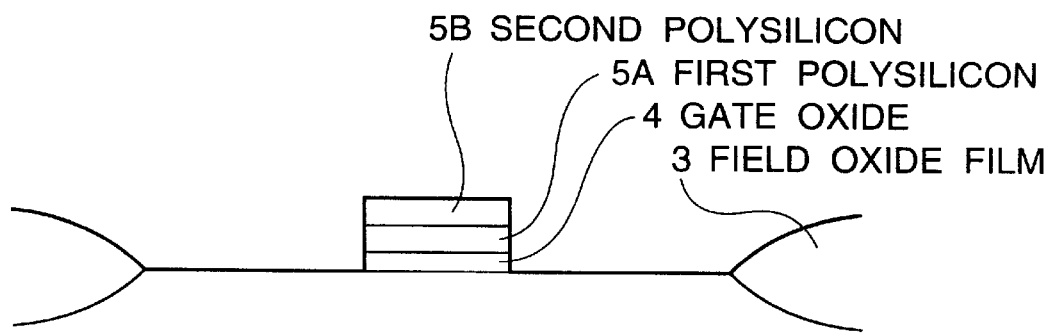
FIG. 2 is a diagrammatic partial sectional view of a semiconductor device for illustrating another prior art process of manufacturing a semiconductor device.
Figure 3:
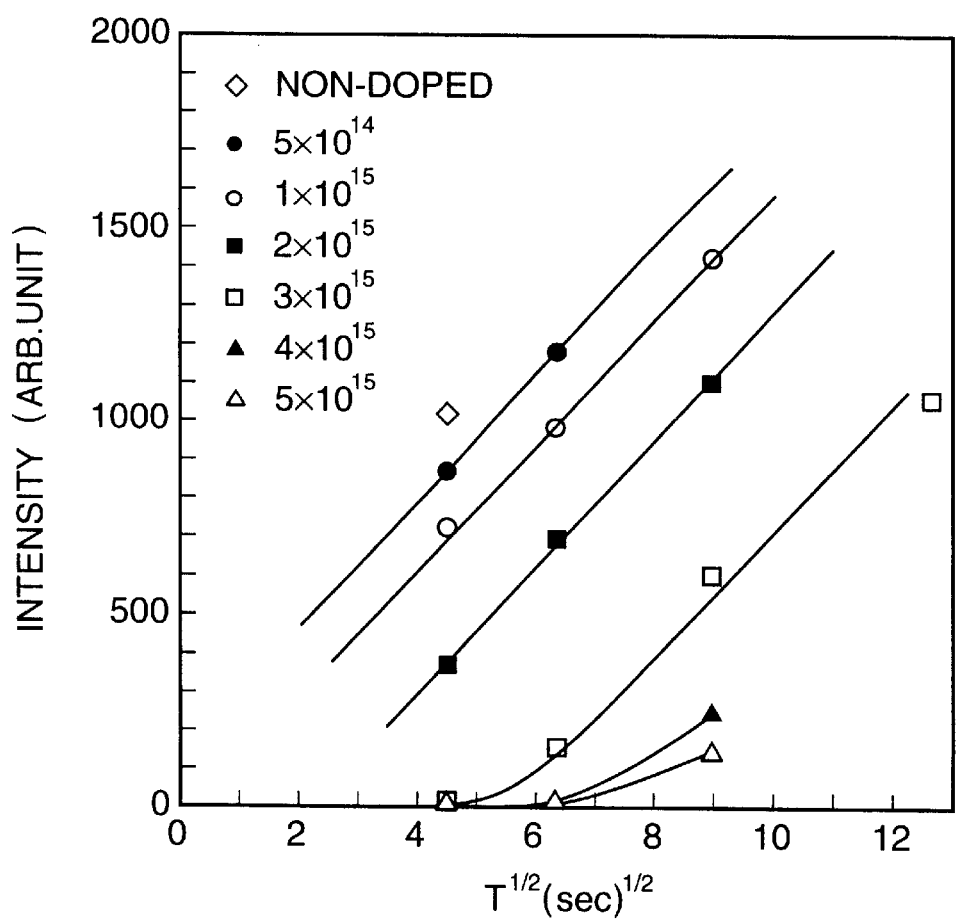
FIG. 3 is a graph illustrating the treatment time of the heat treatment versus the film thickness of a titanium silicide film (TiSi$_2$) formed in the heat treatment, for arsenic ion-implantation doses.
Figure 4A:
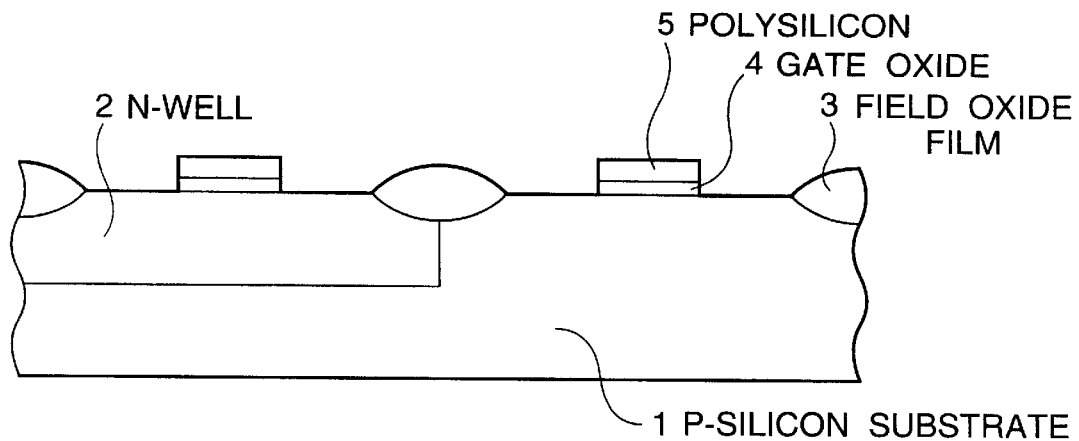
FIGS. 4A to 4D are diagrammatic partial section views of a semiconductor device for illustrating an embodiment of the process in accordance with the present invention for forming a refractory metal silicide.

FIG. 4A illustrates a condition in which a gate electrode is formed on a silicon substrate in accordance with a conventional process. Namely, an N-well 2 is formed selectively on a principal surface region of a P-type silicon substrate 1, and a field oxide film 3 for a device isolation is formed on the principal surface of the substrate 1 to confine a plurality of device formation regions. Furthermore, an oxide film is formed on the whole surface and a polysilicon layer is formed on a whole of the oxide film, and then, the stacked structure of the oxide film and the polysilicon layer is patterned to form, on the N-well 2 and on the substrate 1, a stacked gate structure composed of an gate oxide film 4 and the polysilicon gate electrode 5 stacked thereon.

Figure 4B:
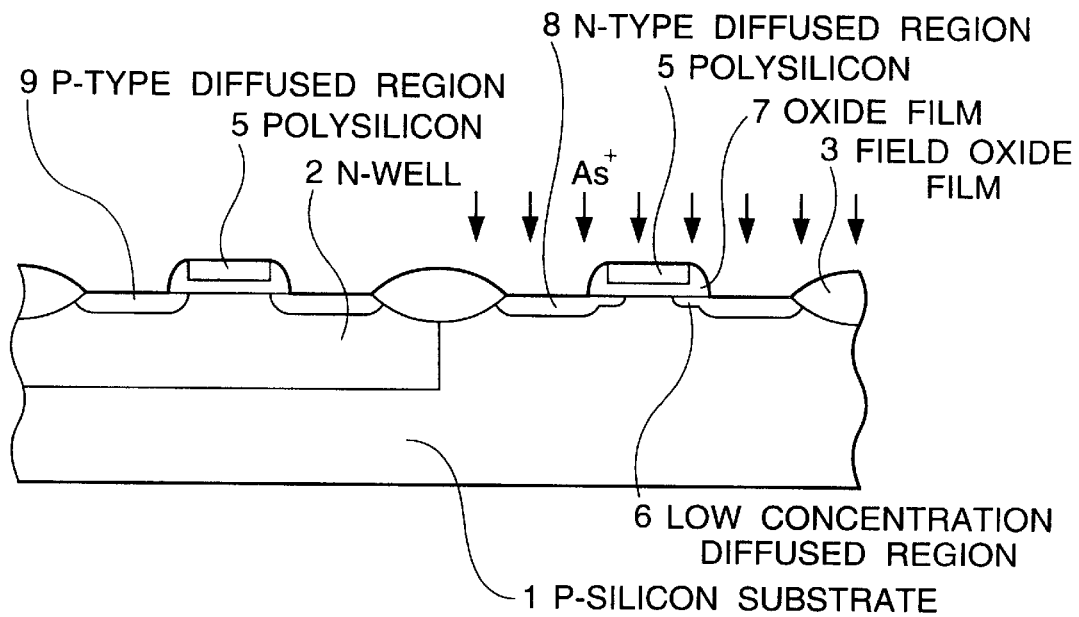

As shown in FIG. 4B, in order to form a LDD (lightly doped drain) structure of an N-channel MOS transistor, an N-type impurity such as phosphorus is ion-implanted to the principal surface region of the substrate 1, by using the polysilicon gate electrode 5 as a mask, so that a pair of shallow diffused regions 6 having a low impurity concentration are formed at opposite sides of the stacked gate structure. Thereafter, an oxide film 7 is formed at opposite side surfaces of the stacked gate structure, and an N-type impurity such as arsenic is ion-implanted to the principal surface region of the substrate 1 with a high concentration, by using the polysilicon gate electrode 5 and the side oxide film 7 as a mask, so that an N-type diffused region 8 (source/drain region) is formed at each side of the stacked gate structure. At this stage of the process, arsenic is ion-implanted to the polysilicon gate electrode 5 of the stacked gate structure. In the above mentioned N-type impurity ion-implanting process, the surface of the silicon substrate is coated with an extremely thin oxide film.

Similarly, a P-channel MOS transistor is formed in the N-well 2. Namely, P-type impurity such as boron fluoride is ion-implanted to the principal surface region of the N-well 2 with a high concentration, so that a P-type diffused region 9 (source/drain region) is formed at each side of the stacked gate structure in the N-well 2. In this P-type impurity ion-implanting process, the surface of the N-well is coated with an extremely thin oxide film.

Thereafter, in order to activate impurities in both the N-type and P-type diffused regions, a heat treatment is carried out in a nitrogen atmosphere at a temperature of 900° C. for a time of 30 minutes.

Figure 4C:
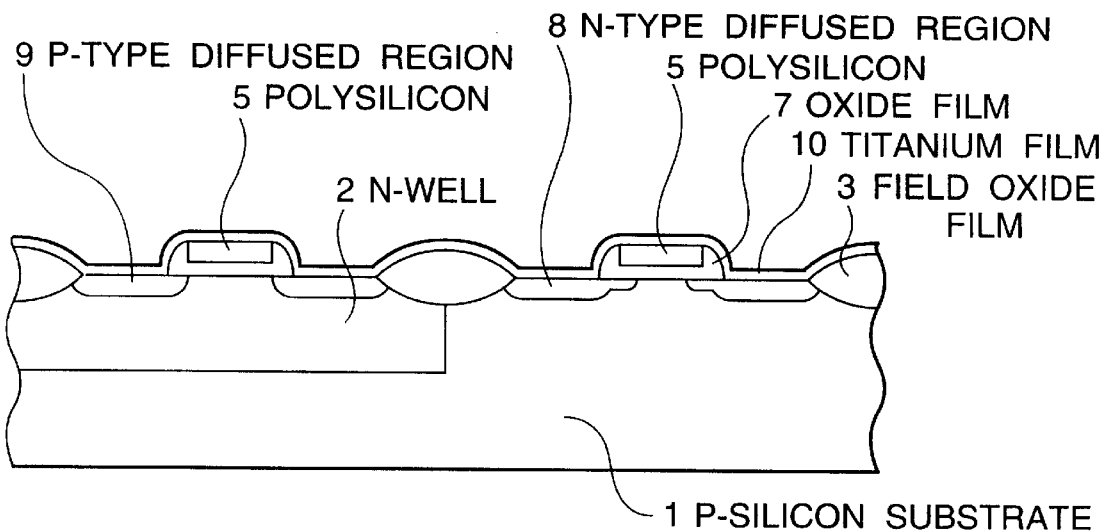

Then, as shown in FIG. 4C, a titanium film 10 (as a refractory metal film) having a thickness of 30 nm is formed on the whole surface by a sputtering. In order to form a titanium silicide ($TiSi_2$) film on the diffused regions 8 and 9 and the polysilicon gate electrode 5, a first heat treatment is performed in a nitrogen atmosphere at a temperature of 650° C. for a time of 30 seconds by means of a lamp annealing method.

Here, at the time of forming the N-type diffused regions 8 by the ion-implantation of arsenic, the following elaboration is so made as to create such a result that the arsenic concentration at a boundary between the TiSi2 film and the silicon substrate is less than $5 \times 10^{20}$ $cm^{-3}$.

Figure 5:
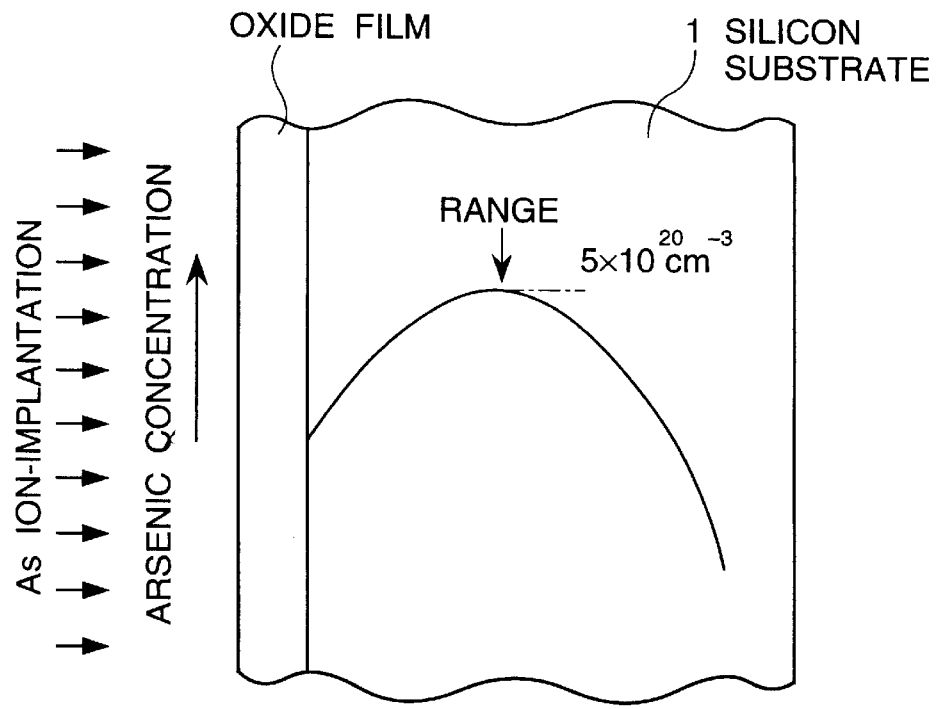
FIG. 5 is a graph illustrating a concentration distribution of ion-implanted arsenic in the first embodiment of the present invention.

Referring to FIG. 5, there is shown a graph illustrating a concentration distribution of ion-implanted arsenic when the arsenic is ion-implanted through an oxide film.

As shown in FIG. 5, the peak of concentration of the implanted arsenic ions is within the silicon substrate 1, and the arsenic concentration at the peak of the concentration is less than $5 \times 10^{20}$ $cm^{-3}$. Therefore, since the arsenic concentration is less than $5 \times 10^{20}$ $cm^{-3}$ over the whole of the silicon substrate 1, it is possible to prevent the retardation of the silicide formation reaction caused by the arsenic. As a result, at the time of the first heat treatment, it is possible to form a titanium silicide film having a uniform thickness on both the P-type and N-type diffused regions.

Figure 4D:
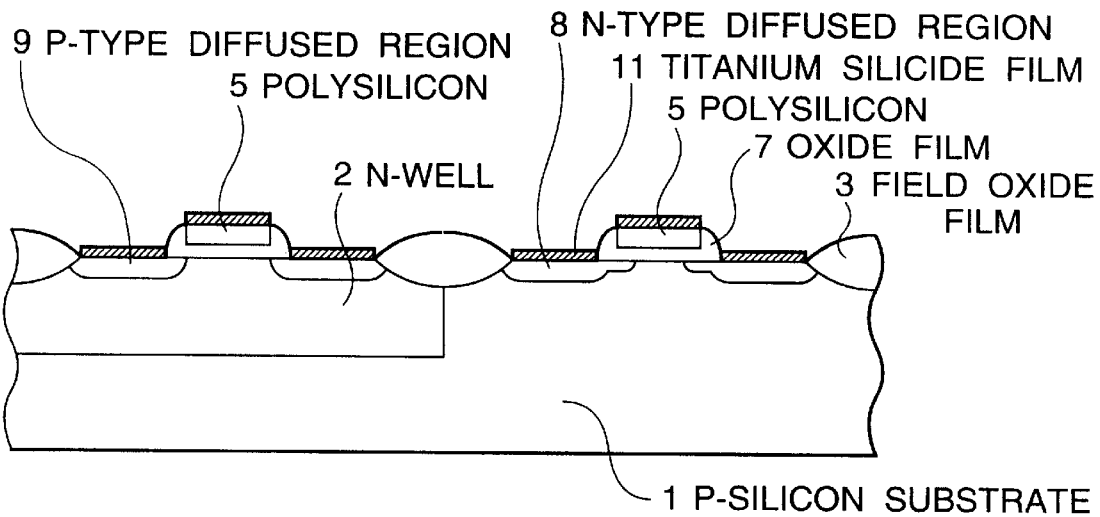

Thereafter, in accordance with a conventional process, unreacted titanium and titanium nitride remaining on the titanium silicide thus formed and on the silicon oxide 3 and 7, are removed by an ammonia hydrogen peroxide aquasolution. Then, a second heat treatment is carried out at a temperature of 850° C. for a time of ten seconds, so that, as shown in FIG. 4D, a titanium silicide film 11 having a uniform thickness and a C54 structure of a low resistance, is selectively formed on the N-type diffused regions 8, the P-type diffused regions 9 and the polysilicon gate oxide 5.

Thus, it is possible to prevent an increase of a sheet resistance of the silicide layer on the N-type diffused regions, and also to avoid the drop of the on-current and the generation of leakage between the gate and the source/drain region in the P-channel MOS transistor including the P-type diffused regions.

Thereafter, an interlayer insulating film is formed, and necessary contact holes are formed. Furthermore, metal wiring conductors are formed, and a protection film is formed.

Figure 6:
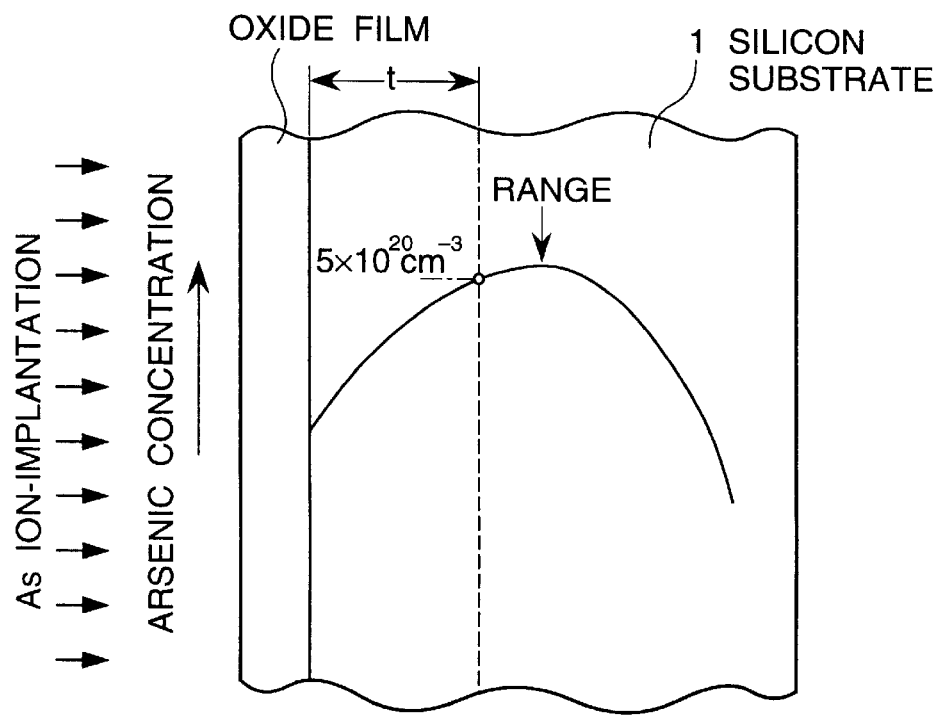
FIG. 6 is a graph illustrating a concentration distribution of ion-implanted arsenic in a second embodiment of the present invention.

Now, a second embodiment of the process in accordance with the present invention for forming a refractory metal silicide, will be described with reference to FIG. 6, which is a graph illustrating a concentration distribution of ion-implanted arsenic in a second embodiment of the present invention.

A process for manufacturing the CMOS semiconductor device is the same as that of the first embodiment described with reference to FIGS. 4A to 4D. In addition, when arsenic is ion-implanted into the N-type diffused regions 8, it is so controlled that the peak of the concentration of the implanted arsenic ions is within the silicon substrate, similarly to the first embodiment. At this time, however, the condition for the ion-implantation is so set that the depth of the peak of the concentration is deeper than a depth "t" of the silicon substrate 1 which will be consumed or expended when the silicon substrate 1 reacts with the titanium film 10 to form the titanium silicide 11, and furthermore, the arsenic concentration at the depth "t" of the silicon substrate 1 is $5 \times 10^{20}$ $cm^{-3}$. With this arrangement, no silicide formation reaction retardation caused by arsenic occurs until the depth "t".

On the other hand, at a position deeper than the depth "t", the arsenic concentration becomes maximum. Therefore, the contact resistance can be reduced to a maximum extent without retarding the silicide formation reaction.

For example, in the case that a titanium film 10 (as the refractory metal film) having a thickness of 30 nm is formed by sputtering, if the first heat treatment is carried out at the temperature of 650° C. for a time of 30 seconds to form the silicide film 11, the silicon substrate 1 is consumed or expended to a thickness of about 36 nm. Therefore, in the case of ion-implanting arsenic through the oxide film having a thickness of 5 nm with an acceleration energy of 70 KeV and a dose of $1\times10^{15}$ cm$^{-2}$, the peak of the concentration of the ion-implanted arsenic matches with the depth "t" by which the silicon substrate is consumed or expended by the silicide formation reaction, and the arsenic concentration at the depth "t" is $5\times10^{20}$ cm$^{-3}$. At this time, in order to form the shallow N-type diffused region having a low impurity concentration, phosphorus is ion-implanted with a dose of a few $\times10^{13}$ cm$^{-2}$, and in order to form the P-type diffused regions 9, boron fluoride is ion-implanted with a dose of $3\times10^{15}$ cm$^{-2}$. Thus, the contact resistance can be reduced to a maximum extent without retarding the silicide formation reaction by arsenic. In addition, since TiSi$_2$ thus formed includes unnecessary arsenic, the phase transition of TiSi$_2$ to the C54 phase at the second heat treatment becomes easy.

As seen from the above, according to the process in accordance with the present invention, it is possible to prevent the retardation of the silicide formation reaction caused by impurity typified by arsenic, in the process of forming a refractory metal silicide, for example, a titanium silicide. As a result, even if the silicide formation reaction is carried out under the same condition, it is possible to form a refractory metal silicide having a uniform film thickness on all an N-type diffused region and a P-type diffused region. Therefore, it is possible to prevent an increase of resistance of the silicide layer and an increase of a contact resistance in the N-type diffused region, and also prevent a drop of the on-current and leakage between the gate and the source/drain region in the P-type diffused region.

The invention has thus been shown and described with reference to the specific embodiments. However, it should be noted that the present invention is in no way limited to the details of the illustrated structures but changes and modifications may be made within the scope of the appended claims.

I claim:

1. A method for manufacturing a semiconductor device, including the steps of ion-implanting arsenic into a silicon layer formed of single crystal silicon, depositing a refractory metal film on said silicon layer, carrying out a first heat treatment at a first temperature for forming a refractory metal silicide, removing a refractory metal remaining on a refractory metal silicide formed by said first heat treatment and a reaction product of the refractory metal other than said refractory metal silicide, and carrying out a second heat treatment on said refractory metal silicide at a second temperature higher than said first temperature, wherein said ion-implantation of the arsenic is so carried out that a concentration distribution of the arsenic at a boundary between said silicon layer and said refractory metal silicide thus formed is lower than the concentration of arsenic within the silicon layer, and is less than $5\times10^{20}$ cm$^{-3}$ in order to prevent a silicide formation reaction retardation.

2. A method as claimed in claim 1 wherein, in said ion-implantation of arsenic, the peak of the concentration of the implanted arsenic ions is within said silicon layer.

3. A method as claimed in claim 1 wherein a concentration distribution of arsenic is such that the concentration of the arsenic within said silicon layer is higher than the concentration of the arsenic within said silicon layer at a boundary between said refractory metal silicide and said silicon layer, but is less than $5\times10^{20}$ cm$^{-3}$.

4. A method for manufacturing a semiconductor device, comprising the steps of:

ion-implanting arsenic into a silicon layer formed of single crystal silicon to realize such an ion-implanted condition that the peak of the concentration of the ion-implanted arsenic is not shallower than the depth by which said silicon layer is consumed or expended by a future silicide formation reaction, and the arsenic concentration at a surface of said silicon layer is less than $5\times10^{20}$ cm$^{-3}$;

depositing a refractory metal film on said silicon layer;

carrying out a first heat treatment at a first temperature for forming a refractory metal silicide;

removing a refractory metal remaining on a refractory metal silicide formed by said first heat treatment and a reaction product of the remaining refractory metal, so as to selectively form a refractory metal silicide layer; and carrying out a second heat treatment on said refractory metal silicide layer at a second temperature higher than said first temperature, so that a concentration of the arsenic at a boundary between said refractory metal silicide layer and said silicon layer is less than $5\times10^{20}$ cm$^{-3}$, and said refractory metal silicide layer thus formed has a uniform thickness.

5. A method as claimed in claim 4 wherein a concentration distribution of arsenic is so that the concentration of the arsenic in said silicon layer at a boundary between said refractory metal silicide and said silicon layer is lower than the concentration of the arsenic within said silicon layer, and is less than $5\times10^{20}$ cm$^{-3}$.

6. A method as claimed in claim 5 wherein, in said ion-implantation of arsenic, the peak of the concentration of the implanted arsenic ions is within said silicon layer.

7. A method as claimed in claim 4 wherein a concentration distribution of arsenic is such that the concentration of the arsenic within said silicon layer is higher than the concentration of the arsenic within said silicon layer at a boundary between said refractory metal silicide and said silicon layer, but is less than $5\times10^{20}$ cm$^{-3}$.

8. A method as claimed in claim 7 wherein said silicon layer is formed of a single crystalline silicon substrate.

9. A method as claimed in claim 7 wherein said silicon layer is formed of a single crystalline silicon well.

10. A method for manufacturing a semiconductor device, comprising the steps of:

ion-implanting arsenic into a silicon layer formed of single crystal silicon to achieve an arsenic concentration profile in which the peak of the arsenic concentration in a depth direction of said silicon layer is larger than $5\times10^{20}$ cm$^{-3}$ and is deeper than the depth by which said silicon layer is consumed by a subsequent silicide formation reaction, and the arsenic concentration from a surface of said silicon layer to the depth by which said silicon layer is consumed by said subsequent silicide formation reaction, is less than $5\times10^{20}$ cm$^{-3}$;

depositing a refractory metal film on said silicon layer;

carrying out a first heat treatment at a first temperature to form a refractory metal silicide;

removing refractory metal remaining on the refractory metal silicide formed by said first heat treatment and other reaction products of the refractory metal, so as to selectively form a refractory metal silicide layer; and carrying out a second heat treatment on said refractory metal silicide layer at a second temperature higher than said first temperature, so that a concentration of the arsenic at a boundary between said refractory metal silicide layer and said silicon layer is less than $5\times10^{20}$ $cm^{-3}$, and said refractory metal silicide layer thus formed has a uniform thickness.

11. A method as claimed in claim 10 wherein said silicon layer is formed of a single crystalline silicon substrate.

12. A method as claimed in claim 10 wherein said silicon layer is formed of a single crystalline silicon well.

* * * * *